United States Patent
Mizushima et al.

(10) Patent No.: US 8,014,429 B2
(45) Date of Patent: Sep. 6, 2011

(54) WAVELENGTH CONVERSION LASER, IMAGE DISPLAY DEVICE AND LASER PROCESSING DEVICE

(75) Inventors: Tetsuro Mizushima, Hyogo (JP); Hiroyuki Furuya, Osaka (JP); Shinichi Shikii, Nara (JP); Koichi Kusukame, Osaka (JP); Nobuyuki Horikawa, Osaka (JP); Kiminori Mizuuchi, Ehime (JP); Kazuhisa Yamamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 30 days.

(21) Appl. No.: 12/532,213

(22) PCT Filed: Jan. 20, 2009

(86) PCT No.: PCT/JP2009/000176
§ 371 (c)(1),
(2), (4) Date: Sep. 21, 2009

(87) PCT Pub. No.: WO2009/093439
PCT Pub. Date: Jul. 30, 2009

(65) Prior Publication Data
US 2010/0103966 A1    Apr. 29, 2010

(30) Foreign Application Priority Data
Jan. 21, 2008   (JP) ................. 2008-010876

(51) Int. Cl.
*H01S 3/10*   (2006.01)
*G02F 1/35*   (2006.01)
*G02F 2/02*   (2006.01)

(52) U.S. Cl. ............. 372/22; 372/21; 372/20; 359/326; 359/328

(58) Field of Classification Search ............ None
See application file for complete search history.

(56) References Cited

U.S. PATENT DOCUMENTS

| | | | | |
|---|---|---|---|---|
| 5,047,668 A | * | 9/1991 | Bosenberg | 372/21 |
| 5,321,718 A | * | 6/1994 | Waarts et al. | 372/22 |
| 5,377,291 A | * | 12/1994 | Hatakoshi et al. | 385/122 |
| 5,387,998 A | * | 2/1995 | Kitaoka et al. | 372/22 |
| 2004/0071179 A1 | * | 4/2004 | Zanger et al. | 372/21 |
| 2006/0209913 A1 | * | 9/2006 | Yokoyama et al. | 372/22 |
| 2009/0154507 A1 | * | 6/2009 | Bragg et al. | 372/22 |

FOREIGN PATENT DOCUMENTS

| JP | 4-318528 | 11/1992 |
|---|---|---|
| JP | 5-341334 | 12/1993 |

OTHER PUBLICATIONS

International Search Report issued Feb. 24, 2009 in International (PCT) Application No. PCT/JP2009/000176.

* cited by examiner

*Primary Examiner* — Jessica Stultz
*Assistant Examiner* — Sean Hagan
(74) *Attorney, Agent, or Firm* — Wenderoth, Lind & Ponack, L.L.P.

(57) ABSTRACT

A wavelength conversion laser is provided with a pair of fundamental wave reflecting surfaces for reflecting a fundamental wave to define a plurality of fundamental wave paths passing a wavelength conversion element at different angles, and a control unit for controlling wavelength conversion efficiencies so that the wavelength conversion efficiency on a specific one of the plurality of fundamental wave paths extending in different directions between the pair of fundamental wave reflecting surfaces is highest.

11 Claims, 11 Drawing Sheets

WAVELENGTH CONVERSION LASER, IMAGE DISPLAY DEVICE AND LASER PROCESSING DEVICE

FIELD OF THE INVENTION

The present invention relates to a wavelength conversion laser for outputting laser light by wavelength-converting a fundamental wave.

DESCRIPTION OF THE BACKGROUND ART

There has been conventionally known a wavelength conversion laser for outputting light while converting the wavelength of fundamental wave laser light into that of a converted wave such as a second harmonic (second harmonic generation: SHG), a sum frequency wave or a differential frequency wave by using nonlinear optical phenomenon of wavelength conversion element.

A wavelength conversion laser is, for example, provided with a fundamental wave laser light source 101, a lens 102 for condensing fundamental wave laser light emitted from the laser light source 101, a wavelength conversion element 103 for converting the condensed fundamental wave laser light into a second harmonic and a dichroic mirror 104 for separation into fundamental wave laser light and harmonic laser light as shown in FIG. 11.

The wavelength conversion element 103 is made of a nonlinear optical crystal and wavelength-converts the fundamental wave. Specifically, the wavelength conversion element 103 has a crystal orientation, a polarization-reversed structure and the like appropriately adjusted such that the phases of the fundamental wave and the converted wave match. Particularly, a wavelength conversion element having a polarization-reversed structure is capable of highly efficient wavelength conversion even with low power because of quasi-phase matching and can perform various wavelength conversions depending on its design. The polarization-reversed structure is a structure formed with regions where the spontaneous polarization of the wavelength conversion element 103 is periodically reversed.

A conversion efficiency η used for conversion from a fundamental wave into a second harmonic can be expressed as follows if it is assumed that L denotes an interaction length of the wavelength conversion element, P the power of the fundamental wave, A a beam cross-sectional area in the wavelength conversion element and Δk a deviation from a phase matching condition.

$$\eta \propto L^2 P/A \times \sin c^2(\Delta k L/2)$$

In the above equation, upon a deviation from the phase matching condition, the conversion efficiency decreases to reduce the generation of the second harmonic (converted wave). Thus, a control is executed to set the temperature of the nonlinear optical crystal to a specified temperature in a permissible range so that no deviation from the phase matching condition occurs.

For example, it has been proposed to control the driving of a temperature regulator so that the light intensity of a converted wave converges to a target value using a detector for detecting the light intensity of the converted wave and the temperature regulator for a nonlinear crystal as disclosed in patent literature 1.

According to a construction of patent literature 1, it is possible to obtain a high conversion efficiency and control the output of a wavelength conversion laser.

However, it is not proposed in patent literature 1 to control an intensity distribution of the converted wave emitted from the wavelength conversion laser by controlling the wavelength conversion efficiency.

[Patent Literature 1]

Japanese Unexamined Patent Publication No. H04-318528

SUMMARY OF THE INVENTION

An object of the present invention is to provide a wavelength conversion laser capable of controlling an intensity distribution of a converted wave to be emitted by controlling a wavelength conversion efficiency, and an image display device and a laser processing device using such a wavelength conversion laser.

One aspect of the present invention is directed to a wavelength conversion laser, comprising a fundamental wave light source for emitting a fundamental wave; a wavelength conversion element for converting the fundamental wave from the fundamental wave light source into a converted wave; a pair of fundamental wave reflecting surfaces for reflecting the fundamental wave to define a plurality of fundamental wave paths passing the wavelength conversion element at different angles; and a control unit for controlling wavelength conversion efficiencies so that the wavelength conversion efficiency on a specific one of the plurality of fundamental wave paths extending in different directions between the pair of fundamental wave reflecting surfaces is highest, wherein at least one of the pair of fundamental wave reflecting surfaces serves as an output surface for transmitting the converted wave.

Another aspect of the present invention is directed to an image display device, comprising the above wavelength conversion laser; and a modulation element for modulating a converted wave emitted from the wavelength conversion laser to display a specified image.

Still another aspect of the present invention is directed to a laser processing device, comprising the above wavelength conversion laser; and a condensing optical element for condensing a converted wave emitted from the wavelength conversion laser, wherein a spot shape of the converted wave is changed by increasing or decreasing the number of optical paths for emitting converted waves out of the respective fundamental wave paths.

According to the present invention, an intensity distribution of a converted wave to be emitted can be controlled by controlling a wavelength conversion efficiency.

DETAILED DESCRIPTION OF THE INVENTION

Hereinafter, embodiments of the present invention are described with reference to the accompanying drawings. The following embodiments are specific examples of the present invention and not of the nature to limit the technical scope of the present invention.

The embodiments of the present invention are described with reference to the drawings below.

First Embodiment

Figure 1:
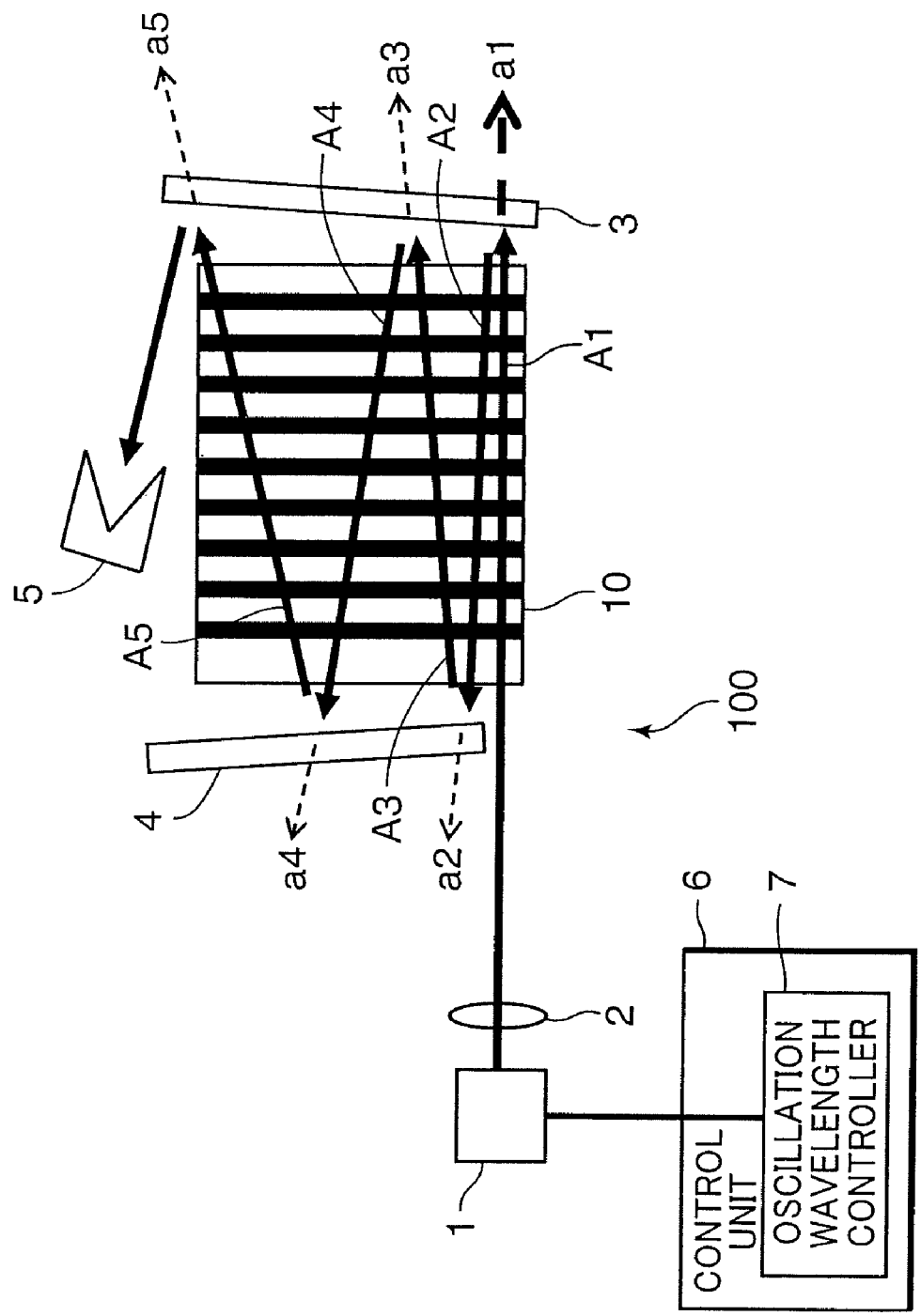
FIG. 1 is a schematic construction diagram of a wavelength conversion laser according to a first embodiment of the invention.
Figure 2:
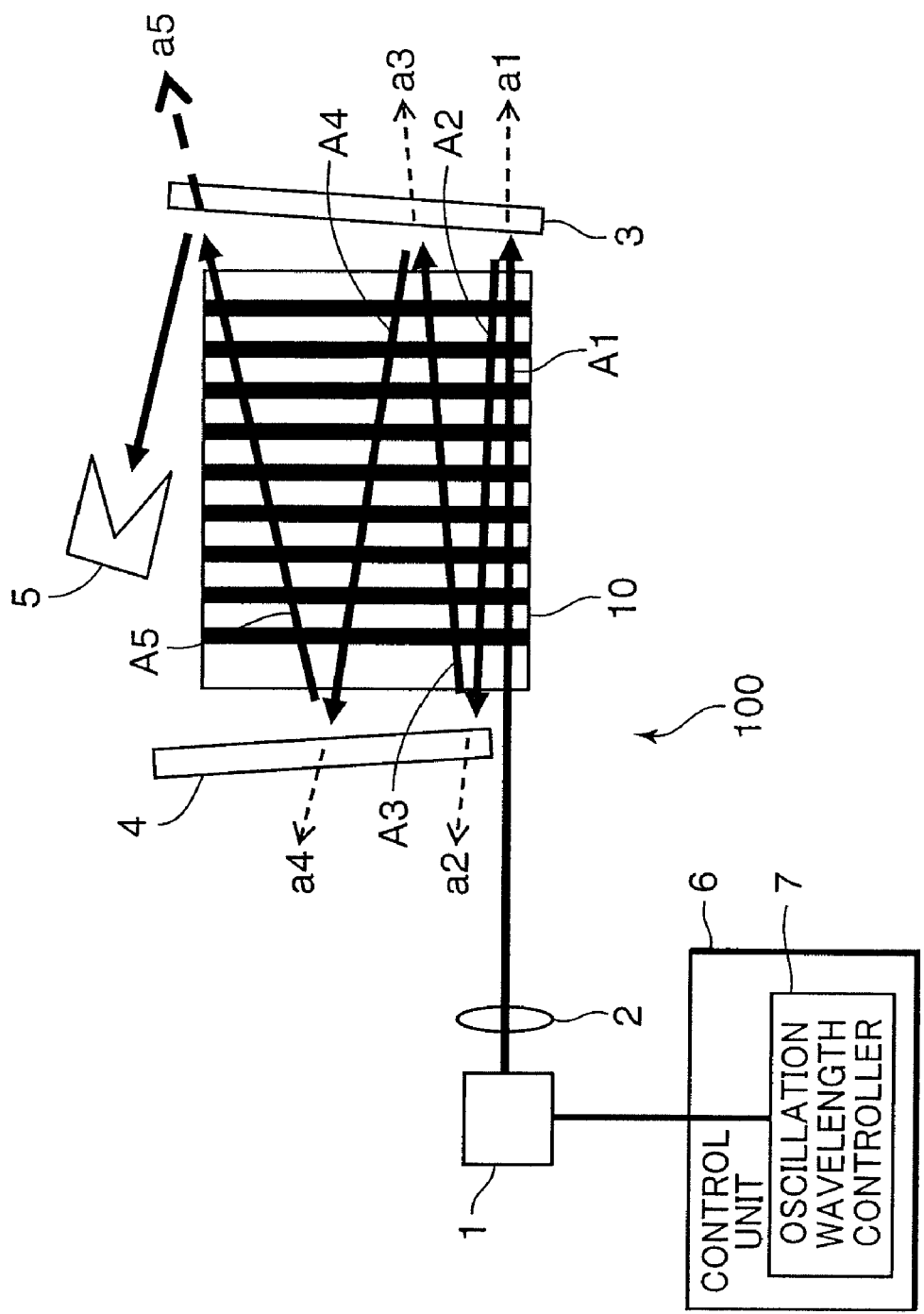
FIG. 2 is a schematic construction diagram showing a state where a fundamental wave path for preferentially emitting a converted wave is changed in the wavelength conversion laser of FIG. 1.

FIGS. 1 and 2 are schematic construction diagrams of a wavelength conversion laser 100 according to a first embodiment of the present invention. FIGS. 1 and 2 differ in a fundamental wave path for preferentially emitting a converted wave.

The wavelength conversion laser 100 is provided with a distributed feedback (hereinafter, abbreviated as "DFB") laser 1 as a laser light source for emitting a fundamental wave, a collimator 2 for collimating the fundamental wave emitted from the DFB laser 1, a wavelength conversion element 10 on which the collimated fundamental wave is to be incident, a pair of dichroic mirrors (fundamental wave reflecting surfaces, output surface) 3, 4 arranged at the opposite sides of the wavelength conversion element 10, a beam diffuser 5 for absorbing the fundamental wave and a control unit 6 for controlling wavelength conversion efficiencies.

The DFB laser 1 includes a grating provided in an LD active layer region and can easily obtain a longitudinal single mode output. The DFB laser 1 can modulate an oscillation frequency by tuning the grating for determining the oscillation wavelength by an electric field or temperature. Specifically, the oscillation wavelength of the DFB laser 1 can be selected from a range of 1064 to 1066 nm, and the DFB laser 1 can make a longitudinal single mode output at each wavelength.

The wavelength conversion element 10 is made of a MgO:LiTaO$_3$ crystal having a periodically polarization-reversed structure and has a rectangular parallelepipedic shape. Specifically, the wavelength conversion element 10 has the periodically polarization-reversed structure arranged in a lateral direction of FIG. 1 and generates a second harmonic as a converted wave from a fundamental wave by quasi-phase matching of a reversal period. The wavelength conversion element 10 has a uniform polarization reversal period therein and is held at a constant temperature by a constant temperature holding mechanism. Coating is applied to an end surface of the wavelength conversion element 10, on or from which the fundamental wave is incident or emitted (left or right end surfaces of FIG. 1) so as to transmit the fundamental wave and the second harmonic.

The dichroic mirrors 3, 4 are so arranged at the opposite sides of the wavelength conversion element 10 as to define a plurality of fundamental wave paths passing the wavelength conversion element 10 at different angles. The dichroic mirrors 3, 4 are specifically described below.

The dichroic mirror 3 has such a coating as to reflect the fundamental wave and transmit the second harmonic. The dichroic mirror 3 is inclined in a lengthwise direction of the wavelength conversion element 10 (lateral direction of FIG. 1) from a vertical posture with respect to an optical path of the fundamental wave emitted from the DFB laser 1. Accordingly, the fundamental wave reflected by the dichroic mirror 3 is incident again on the wavelength conversion element 10 along an optical path inclined in the lengthwise direction of the wavelength conversion element 10.

The dichroic mirror 4 also has such a coating as to reflect the fundamental wave and transmit the second harmonic. The dichroic mirror 4 is inclined at an angle laterally symmetrical with that of the dichroic mirror 3 in FIG. 1. Accordingly, the fundamental wave reflected by the dichroic mirror 4 is incident again on the wavelength conversion element 10 along an optical path inclined in the lengthwise direction of the wavelength conversion element 10.

By inclining the dichroic mirrors 3, 4 relative to each other in this way, fundamental wave paths A1 to A5 gradually heading toward an upper side of FIG. 1 are defined between these dichroic mirrors 3, 4. These fundamental wave paths A1 to A5 extend in different directions between the dichroic mirrors 3, 4. The respective fundamental wave paths A1 to A5 have larger angles of inclination with respect to the polarization reversal period of the wavelength conversion element 10 in the order of A1 to A5 and, accordingly, the polarization reversal period the fundamental wave passes becomes longer. The dichroic mirrors 3, 4 form output surfaces for wavelength converted light.

The control unit 6 includes an oscillation wavelength controller 7 for controlling the wavelength of the fundamental wave oscillated from the DFB laser 1. The oscillation wavelength controller 7 controls the wavelength of the fundamental wave so that the wavelength conversion efficiency on a specific one of the fundamental wave paths A1 to A5 is highest. Specifically, the oscillation wavelength controller 7 adjusts the oscillation wavelength by generating a desired electric field in the grating of the DFB laser 1.

The fundamental wave emitted from the DFB laser 1 is incident on the wavelength conversion element 10 after being collimated by the collimator 2. In an example shown in FIG. 1, phase matching is performed on the fundamental wave path A1 perpendicular to the polarization reversal period by setting the oscillation wavelength of the DFB laser 1 to 1064 nm using the oscillation wavelength controller 7, and a converted wave (second harmonic) a1 is generated at a highest conversion efficiency on this fundamental wave path A1. At this time, on the fundamental wave paths A2 to A5, deviations from phase matching condition occur, the conversion efficiencies decrease and converted waves (second harmonics) a2 to a5 are generated only little since the fundamental wave paths A2 to A5 are obliquely arranged with respect to the polarization-reversed structure of the wavelength conversion element 10 due to the reflections of the dichroic mirrors 3, 4. Thus, the converted wave a1 generated on the fundamental wave path A1 is preferentially emitted from the dichroic mirrors 3, 4 as the output surfaces of the converted wave. The remaining fundamental wave that was not wavelength-converted reaches the beam diffuser 5 to be absorbed.

In an example shown in FIG. 2, phase matching is performed on the fundamental wave path A5 most inclined with respect to the polarization reversal period by setting the oscillation wavelength of the DFB laser 1 to 1066 nm using the oscillation wavelength controller 7, and a second harmonic is generated at a highest conversion efficiency on this fundamental wave path A5. At this time, on the fundamental wave paths A1 to A4, deviations from the phase matching condition occur, the conversion efficiencies decrease and second harmonics are generated only little since the polarization reversal periods are shorter than a period for satisfying the phase matching condition. Thus, the converted wave a5 generated on the fundamental wave path A5 is preferentially emitted from the dichroic mirrors 3, 4 as the output surfaces of the converted wave.

Similarly, the fundamental wave path for phase matching is selected from the fundamental wave paths A2, A3 and A4 by modulating the oscillation wavelength of the DFB laser 1 using the oscillation wavelength controller 7, and converted waves a2 to a4 generated on the respective optical paths S2 to S4 can be preferentially emitted.

It is also possible to emit scanning light using the wavelength conversion laser 100. Specifically, the fundamental wave paths to be selected can be successively changed in an order of A1→A2→A3→A4→A5→A4→ A3→A2→ A1→ A2 . . . by modulating the oscillation wavelength of the DFB laser 1 in a constant cycle in the range of 1064 to 1066 nm. Since emission angles of the converted waves emitted at this time differ depending on the fundamental wave paths to be selected, the converted waves are successively emitted at different angles to repeat the scanning of the wavelength-converted light. This scanning speed can be controlled by the modulation speed of the oscillation wavelength. The above construction is preferable in scanning the emitted wavelength-converted light by successively selecting the fundamental wave paths using the control unit 6. By doing so, beam scanning can be performed only by using the wavelength conversion laser without using any movable minor or the like, wherefore it is possible to reduce the number of components and reduce loss. In the case of scanning the converted waves by the modulation of the oscillation wavelength of the fundamental wave, the wavelength of the converted wave at each scanning position differs. Therefore, spectroscopic measurement or the like can be performed using one light source.

Besides the DFB laser, various laser light sources such as a semiconductor laser, a fiber laser and a solid-state laser can be used as the fundamental wave laser light source of the present invention. Although the collimator 2 is used for beam shaping of the fundamental wave in the first embodiment, various optical components can be used for beam shaping and divergent angle control of the fundamental wave to the wavelength conversion element. Various nonlinear materials can be used as the wavelength conversion element. For example, LBO, KTP and $LiNbO_3$ and $LiTaO_3$ having a periodically polarization-reversed structure can be used.

Although two plane mirrors are used as the dichroic minors 3, 4 and both of these plane mirrors are obliquely arranged in this embodiment, only one plane minor may be obliquely arranged. An angle of inclination of the plane minor is preferably at least equal to or larger than 1° to provide the fundamental wave paths with a certain degree of angular variation.

Further, although both of the pair of dichroic minors 3, 4 serve as the output surfaces for the converted waves in this embodiment, it is sufficient to set at least one of the dichroic mirrors 3, 4 as a surface for outputting the wavelength-converted light.

This embodiment is preferable in selecting the preferential fundamental wave path A1 to AS by modulating the oscillation wavelength of the fundamental wave using the oscillation wavelength controller 7. By modulating the oscillation wavelength of the fundamental wave in this way, not only the angle and intensity distribution of the wavelength-converted light, but also the wavelength of the converted wave to be emitted can be modulated. In the case of modulating the oscillation wavelength, it is preferable to set a modulation frequency to or above 100 Hz for high-speed modulation. By performing the modulation at a high speed, it is possible to increase an apparent spectral width and reduce coherency in the case of using wavelength-converted light for image display and illumination.

The angular variation of the converted waves to be emitted can be speeded up by changing the oscillation wavelength of the DFB laser 1 at a high speed. It is preferable to use the DFB laser 1 and modulate the electric field in the grating for the high-speed modulation of the oscillation wavelength as in this embodiment. By doing so, it is possible to control the oscillation wavelength at a very high speed.

A modification of the first embodiment is described below with reference to FIG. 3.

Figure 3:
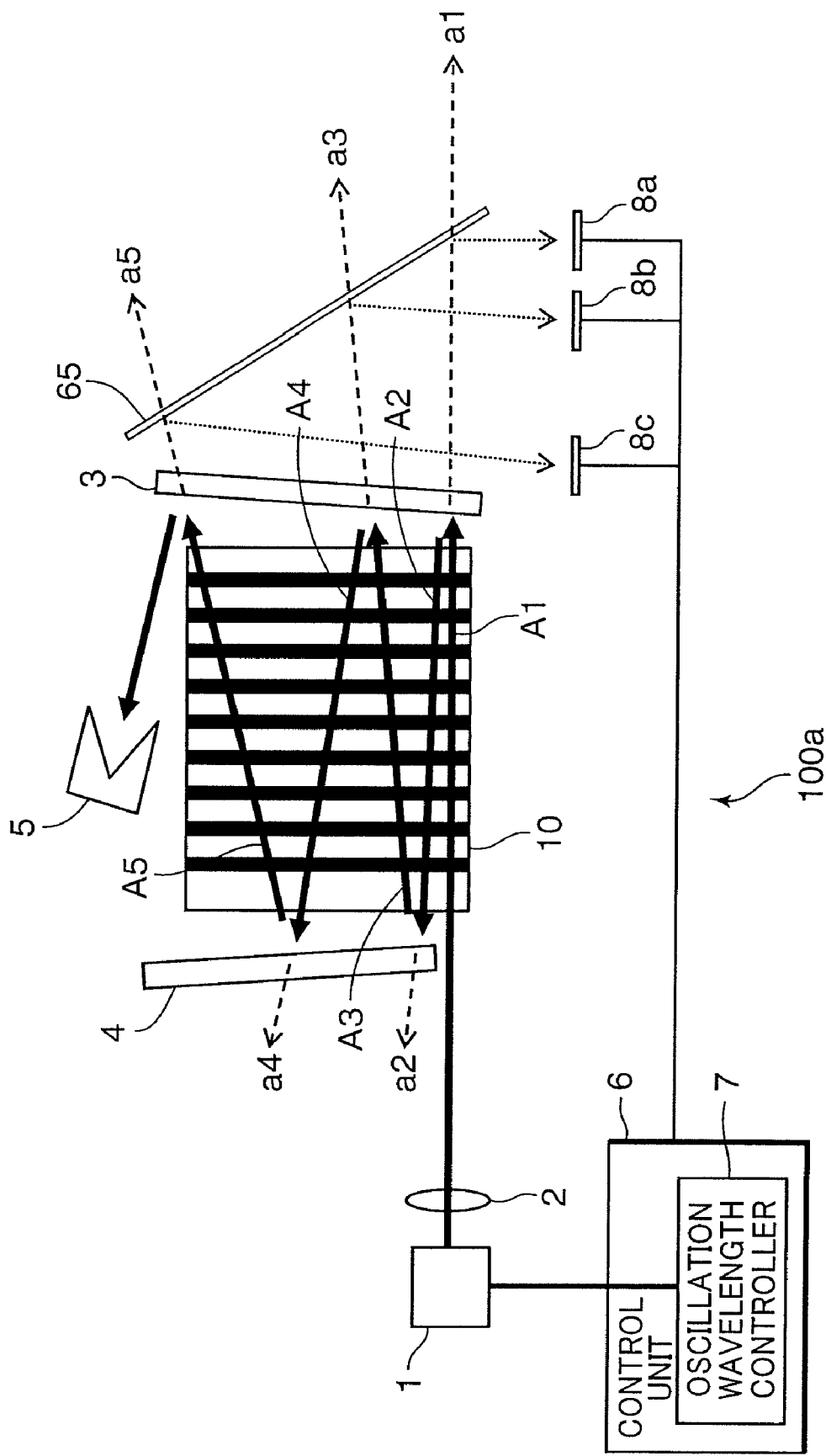
FIG. 3 is a schematic construction diagram of the wavelength conversion laser according to a modification of the first embodiment of the invention.

FIG. 3 is a schematic diagram of a wavelength conversion laser 100a according to the modification of the first embodiment. A construction similar to the above wavelength conversion laser 100 is identified by the same reference numerals and not described.

In addition to the construction of the wavelength conversion laser 100, the wavelength conversion laser 100a includes light receiving elements 8a, 8b and 8c for receiving parts of converted waves a1, a2 and a3 emitted from fundamental wave paths A1, A3 and A5 and a sampler 65.

The light receiving elements 8a to 8c detect the light quantities of the received converted waves and detect which one of the light quantities incident on the light receiving elements 8a to 8c is largest based on differences of detection values.

The sampler 65 is an optical component for reflecting parts of the converted waves emitted from the wavelength conversion element 10 and introducing them to the light receiving elements 8a to 8c. Specifically, the sampler 65 is a glass plate having a low reflection coating.

In the wavelength conversion laser 100a, fundamental wave paths A1 to A5 for preferentially emitting the converted wave can be selected by changing the wavelength of the DFB laser 1 using the oscillation wavelength controller 7 of the control unit 6. The fundamental wave path, from which the converted wave was preferentially emitted, is detected out of the fundamental wave paths A1, A3 and A5 based on a detection result of the light receiving element having the largest incident light quantity out of the light receiving elements 8a to 8c. The control unit 6 executes a feedback control so that the fundamental wave path detected based on the detection results of the light receiving elements 8a to 8c and the fundamental wave path selected by the oscillation wavelength controller 7 coincide. Thus, the converted wave is constantly preferentially outputted from the selected fundamental wave path.

The wavelength conversion laser 100a has a preferred form including a plurality of light receiving elements 8a to 8c for receiving the converted waves a1, a3 and a5 from the fundamental wave paths A1, A3 and A5 and capable of executing a feedback control to the fundamental wave path selected from the fundamental wave paths A1, A3 and A5.

The above wavelength conversion laser 100a includes a plurality of fundamental wave paths A1 to A5 having different phase matching conditions and the optical path is selected utilizing differences of the phase matching conditions. The phase matching conditions are influenced by surrounding environments and passage of time and may change from initial conditions in some cases. In the wavelength conversion laser 100a, the feedback control is executed based on the detection results of the plurality of light receiving elements 8a to 8c for detecting outputs from the plurality of fundamental wave paths, whereby the output from the intended fundamental wave path can be prioritized regardless of changes of the phase matching conditions. Further, although three light receiving elements 8a to 8c are provided to receive the converted waves a1, a3 and a5 from the fundamental wave paths A1, A3 and A5 in this embodiment, five light receiving elements corresponding to all the fundamental wave paths A1 to A5 may be provided and a feedback control may be executed for all the fundamental wave paths A1 to A5.

The plurality of light receiving elements also mean a mode for using one light receiving element while dividing it. For example, a Si-PD or the like can be used.

A modification of the first embodiment is described below with reference to FIG. 4.

Figure 4:
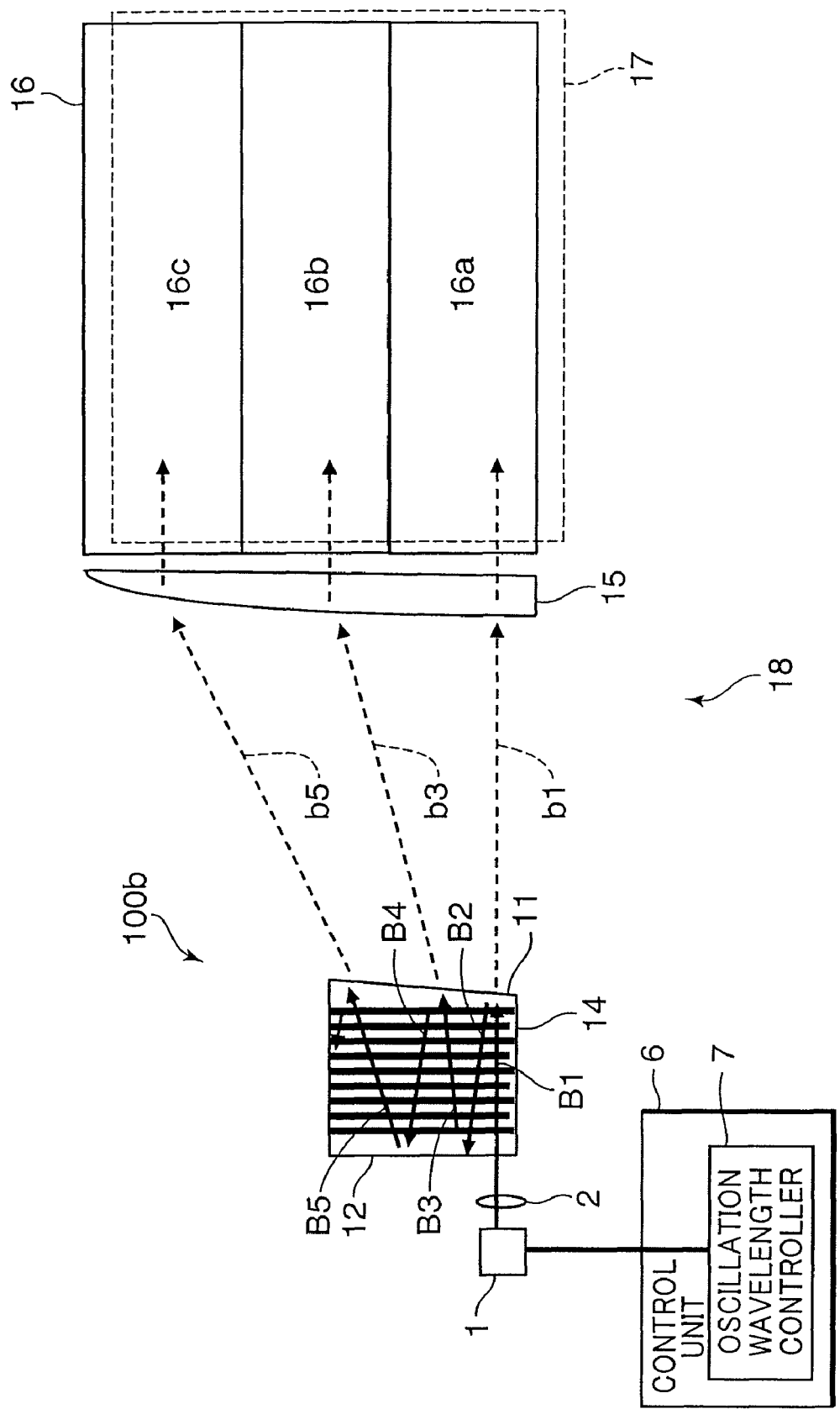
FIG. 4 is a schematic construction diagram of a wavelength conversion laser according to a modification of the first embodiment and an image display device including this wavelength conversion laser.

FIG. 4 is a schematic diagram showing a wavelength conversion laser 100b according to a modification of the first embodiment and an image display device 18 including the wavelength conversion laser 100b. A construction similar to the above constructions is identified by the same reference numerals and not described.

The wavelength conversion laser 100b includes the DFB laser 1, the lens 2, the control unit 6 and a wavelength conversion element 14.

The DFB laser 1 outputs a fundamental wave (near 1064 nm) in such a state where an oscillation wavelength can be changed by the above oscillation wavelength controller 7.

As shown in FIG. 4, the wavelength conversion element 14 has a trapezoidal side shape (trapezoidal shape in which the left side of FIG. 4 is at right angles to the upper base and the lower base) and has a column-like outer shape extending in a direction orthogonal to the plane of FIG. 4. This wavelength conversion element 14 is formed with a polarization-reversed structure arranged in a lateral direction of FIG. 4.

More specifically, the wavelength conversion element 14 has an end surface 12 (left end surface of FIG. 4) perpendicular to the fundamental wave emitted from the DFB laser 1 and an inclined end surface 11 (right end surface of FIG. 4). The end surface 12 has an anti-reflection (AR) coating for reflecting the fundamental wave only on an incident part of the fundamental wave and a high reflection (HR) coating for reflecting the fundamental wave and the converted wave on the other part. The end surface 11 has an HR coating for reflecting the fundamental wave and an AR coating for reflecting the converted wave and is an output surface for the wavelength-converted light. The end surface 11 is inclined with respect to the end surface 12.

The wavelength conversion element 14 is made of MgO:LiNbO$_3$ having a periodical polarization-reversed structure, and a polarization reversal period is formed in a direction of the incident fundamental wave (lateral direction of FIG. 4). The fundamental wave is converted into a green converted wave (near 532 nm) by the wavelength conversion element 14. Since the end surface 11 is inclined with respect to the end surface 12, an optical path of the fundamental wave reflected by the end surface 12 is inclined with respect to the polarization reversal period. Thus, as reflections at the end surface 12 increase, an angle of intersection of the fundamental wave path with the polarization reversal period increases.

Specifically, angles of intersection of fundamental wave paths B1 to B5 with the polarization reversal period increase in the order of B1 to B5. Accordingly, phase matching conditions on the fundamental wave paths B1 to B5 respectively differ depending on the number of reflections at the end surface 12. Thus, it is possible to preferentially output a converted wave from any one of the respective fundamental wave paths B1 to B5 by modulating the wavelength of the fundamental wave by the control unit 6 including the oscillation wavelength controller 7.

Next, the image display device 18 shown in FIG. 4 is described.

The image display device 18 is provided with the above wavelength conversion laser 100b, a lens 15 for deflecting a converted wave from the wavelength conversion element 100b, a light guide plate 16 on which the converted wave from the lens 15 is to be incident, and a liquid crystal panel 17 for displaying an image by the converted wave emitted from the light guide plate 16.

The wavelength-converted light emitted from the wavelength conversion laser 100b is introduced to the light guide plate 16 via the lens 15. The light guide plate 16 makes the beam incident on a side surface thereof uniform, reflects the beam and emits it from a principal surface, thereby illuminating the liquid crystal panel 17 from behind. The liquid crystal panel 17 displays an image by modulating the converted wave in accordance with an image signal. The liquid crystal panel 17 is a general transmissive liquid crystal panel including a polarizer, liquid crystal, TFTs and the like. The light guide plate 16 includes sub-light guide plates 16a, 16b and 16c. The sub-light guide plates 16a, 16b and 16c respectively make the incident converted wave uniform and reflect it toward the liquid crystal panel 17 (toward the principal surface).

A converted wave b1 emitted from the fundamental wave path B1 in the wavelength conversion laser 100b is incident on the sub-light guide plate 16a by being deflected by the lens 15. Similarly, converted waves b3, b5 emitted from the fundamental wave paths B3, B5 are respectively incident on the sub-light guide plates 16b, 16c. Thus, which of the sub-light guide plates 16a to 16c is to be made luminous can be controlled according to which one of the fundamental wave paths B1, B3 and B5 is selected in the wavelength conversion laser 100b.

In this way, in the image display device 18, a luminance distribution on a screen can be controlled by selecting the sub-light guide plate to become luminous out of the sub-light guide plates 16a to 16c. For example, in the case of displaying a pitch-dark image, black is expressed without making any of the sub-light guide plates 16a to 16c luminous. Further, if there are many selectable fundamental wave paths in the wavelength conversion laser 100b, it is also possible to accordingly increase the number of sub-light guide plates.

The image display device 18 has a preferred form in which a converted wave produced on the optical path selected from the fundamental wave paths B1, B3 and B5 is preferentially emitted form the wavelength conversion laser 100b and a modulation element for modulating this converted wave is included. In this way, since the fundamental wave path for emitting the converted wave can be selected in the wavelength conversion laser 100b, a luminance distribution of an image to be displayed on the image display device can be controlled.

Specifically, since the image display device 18 includes the sub-light guide plates 16a to 16c, a part of the liquid crystal panel 17 to become luminous can be selected in conformity with the positions of the sub-light guide plates 16a to 16c. In order to control a luminance distribution of the image display device, the contrast of an image can be increased by shining only the sub-light guide plate(s) arranged at position(s) corresponding to bright parts of an image to be displayed without shining the sub-light guide plate(s) arranged at position(s) corresponding to black part(s) of the image. Further, power consumption can be reduced by not making unnecessary region(s) of the light guide plate 16 luminous.

In the case of displaying a color image, red and blue laser light sources are used in combination in addition to the wavelength conversion laser 100*b*. The luminance distribution of the image display device can be set for each sub-light guide plate by arranging red and blue semiconductor laser light sources for each of the sub-light guide plates 16*a* to 16*b*.

Second Embodiment

Figure 5:
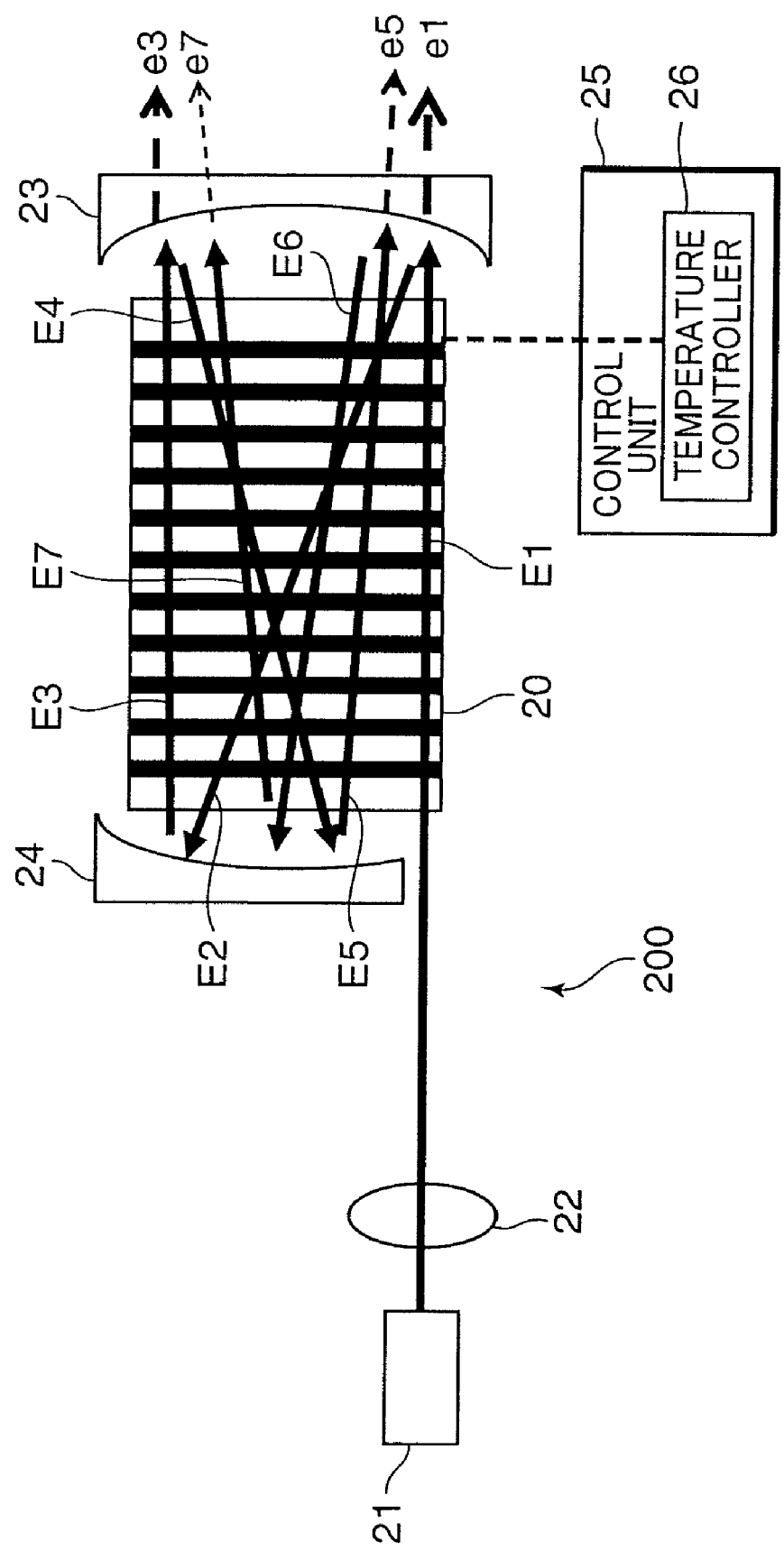
FIG. 5 is a schematic construction diagram of a wavelength conversion laser according to a second embodiment of the invention.
Figure 6:
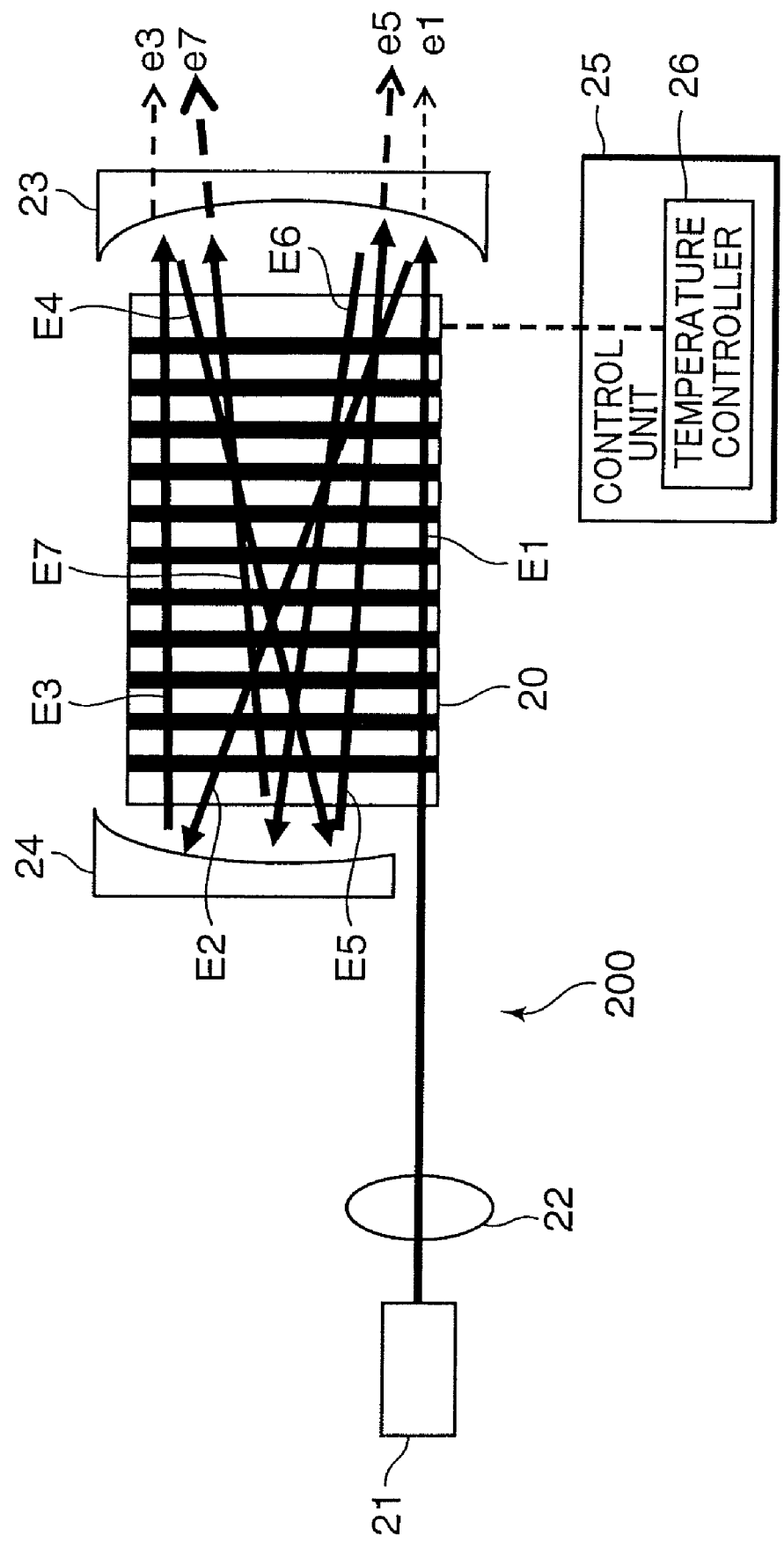
FIG. 6 is a schematic construction diagram showing a state where fundamental wave paths for preferentially emitting converted waves are changed in the wavelength conversion laser of FIG. 5.

FIGS. 5 and 6 are schematic construction diagrams of a wavelength conversion laser 200 according to a second embodiment of the present invention. FIGS. 5 and 6 differ in fundamental wave paths for preferentially emitting converted waves.

The wavelength conversion laser 200 is provided with a fiber laser 21 as a laser light source for emitting a fundamental wave, a condenser lens 22 for condensing the fundamental wave from the fiber laser 21, a wavelength conversion element 20 on which the condensed fundamental wave is to be incident, a pair of concave mirrors 23, 24 arranged at the opposite sides of the wavelength conversion element 20 and a control unit 25 for controlling the temperature of the wavelength conversion element 20.

The fiber laser 21 emits a linearly polarized fundamental wave in a single mode and with an output of 10 W or higher. Since a conversion efficiency of the wavelength conversion element 20 is proportional to the power of the fundamental wave, a high conversion efficiency can be obtained and the high-efficiency wavelength conversion laser 200 can be obtained by utilizing the fiber laser 21. In other words, the fiber laser 21 is a preferred fundamental wave laser light source capable of increasing the efficiency of the wavelength conversion laser 200.

The wavelength conversion element 20 is made of a MgO: LiNbO$_3$ crystal having a periodical polarization-reversed structure and has a rectangular parallelepipedic shape with a length of 25 mm, a width of 5 mm and a thickness of 1 mm. Specifically, the wavelength conversion element 20 has a periodical polarization-reversed structure arranged in a lateral direction of FIG. 5 (lengthwise direction of the wavelength conversion element 20) and generates a second harmonic as a converted wave by quasi-phase matching of a reversal period. A stripe pattern shown in FIGS. 5 and 6 is a rough contour of the periodic structure and the reversal period is about 7 μm and substantially uniform in the wavelength conversion element 20. Coating is applied to incident and emergent end surfaces (left and right end surfaces of FIG. 5) of the wavelength conversion element 20 for the fundamental wave for transmitting the fundamental wave and the second harmonic (converted wave).

The temperature of the wavelength conversion element 20 is controlled by a temperature controller 26 of the control unit 25. Specifically, the temperature of the wavelength conversion element 20 can be controlled by mounting a Peltier element on the bottom surface of the wavelength conversion element 20 and applying a voltage to this Peltier element using the temperature controller 26. At this time, it is preferable to dispose a temperature sensor or the like for detecting the temperature of the wavelength conversion element 20 and execute a feedback control by the temperature controller 26 based on the temperature detected by this temperature sensor. A temperature control may be executed for the entire wavelength conversion element 20 or for a part of the wavelength conversion element 20.

The concave mirror 23 has a coating for reflecting the fundamental wave and transmitting the second harmonic and serves as an output surface for emitting the second harmonic as the converted wave. The concave mirror 24 has a coating for reflecting the fundamental wave and the second harmonic. A radius of curvature of the concave mirror 23 is 22 mm, that of the concave mirror 24 is 20 mm and a distance between the concave mirrors is about 21 mm in air-converted length. The fundamental wave is reflected between the two concave mirrors 23 and 24, thereby reciprocating at different angles in the wavelength conversion element 20 a plurality of times. Further, the two concave mirrors 23, 24 function to condense the fundamental wave on fundamental wave paths in the wavelength conversion element 20. In this way, the conversion efficiency is increased.

The fundamental wave emitted from the fiber laser 21 is so condensed by the condenser lens 22 as to possess a beam waist in the wavelength conversion element 20. The fundamental wave from the condenser lens 22 enters the wavelength conversion element 20 from the end surface of the wavelength conversion element 20 not covered by the concave mirror 24. The fundamental wave emitted from the wavelength conversion element 20 is reflected by the concave mirror 23, thereby being incident on the wavelength conversion element 20 at a different incidence angle. Then, the fundamental wave emitted from the wavelength conversion element 20 is reflected by the concave mirror 24, thereby being incident on the wavelength conversion element 20 at a different incidence angle.

In this way, the fundamental wave reciprocates between the concave mirrors 23 and 24 and passes through the wavelength conversion element at different angles a plurality of times. In other words, a plurality of fundamental wave paths (although only E1 to E7 are illustrated in FIG. 5, more optical paths are actually defined) extending in different directions are defined between the respective concave mirrors 23 and 24. In this embodiment, converted waves e1, e3, e5 and e7 produced on the fundamental wave paths E1, E3, E5 and E7 extending from the left to the right of FIG. 5 out of these fundamental wave paths E1 to E7 pass through the concave mirror 23 to be emitted. This is specifically described below.

The fundamental wave is condensed at a plurality of positions in the wavelength conversion element 20 in the process of reciprocation between the respective concave mirrors 23 and 24. Specifically, in the construction shown in FIG. 5, the fundamental wave is condensed and the conversion efficiency is increased when the fundamental wave is reflected by the concave mirror 24 and passes the wavelength conversion element 20 from the left to the right of FIG. 5 (passing along the fundamental wave paths E1, E3, E5 and E7). The converted wave produced while the fundamental wave is passing through the wavelength conversion element 20 is outputted from the concave mirror 23. On the other hand, the fundamental wave is returned toward the concave mirror 24 again while being so condensed by the concave mirror 23 as not to diverge after passing the beam waist when passing through the wavelength conversion element 20 from the right to the left of FIG. 5 (passing along the fundamental wave paths E2, E4 and E6).

In FIG. 5, the temperature of the wavelength conversion element 20 is controlled and maintained by the temperature controller 26 so as to perform phase matching on the fundamental wave path perpendicular to the periodical polarization-reversed structure of the wavelength conversion element 20. In this embodiment, since the lowermost fundamental wave path E1 and the uppermost fundamental wave path E3 in FIG. 5 are substantially perpendicular to the periodical polarization-reversed structure, deviation amounts from a phase matching condition are small, the conversion efficiency is higher and more converted wave is generated on these fundamental wave paths E1 and E3. Particularly, since the fundamental wave path E1 in this embodiment is substantially orthogonal to the periodical polarization-reversed structure of the wavelength conversion element 20, the wavelength conversion efficiency on this fundamental wave path E1 is largest. In contrast, on the fundamental wave paths E2, E4 and E6 obliquely passing the wavelength conversion element 20, the conversion efficiency is lower and less converted wave is generated since deviation amounts from the phase-matching condition are large. Thus, the converted waves produced on the lowermost fundamental wave path E1 and the uppermost fundamental wave path E3 in FIG. 5 are preferentially emitted.

FIG. 6 shows a state where the temperature of the wavelength conversion element 20 is controlled to a temperature 1° lower than in the example shown in FIG. 5 and this temperature is maintained by the temperature controller 26. In the state shown in FIG. 6, deviation amounts from the phase matching condition are smaller and the conversion efficiency is higher on the fundamental wave paths E5, E7 obliquely crossing the periodical polarization-reversed structure of the wavelength conversion element 20. In contrast, on the fundamental wave paths E1, E3 substantially orthogonal to the periodical polarization-reversed structure, deviation amounts from the phase matching condition are larger and the conversion efficiency is lower. In other words, in the example shown in FIG. 6, the converted waves produced on the fundamental wave paths E5, E7 (optical paths located in a middle part of FIG. 6) obliquely passing the periodical polarization-reversed structure of the wavelength conversion element 20 are preferentially emitted. More specifically, in this embodiment, the wavelength conversion efficiency on the fundamental wave path E7 is set to be highest.

In the second embodiment, the deviation amounts from the phase matching condition on the respective fundamental wave paths E1 to E7 passing the wavelength conversion element 20 at different angles are controlled to preferentially emit the converted wave produced on the specific fundamental wave path by changing the temperature of the wavelength conversion element 20 using the temperature controller 26. In the second embodiment, an intensity distribution of the converted wave to be emitted from the wavelength conversion laser 200 can be controlled by executing such a control as to preferentially emit the converted wave produced on the specific fundamental wave path.

The second embodiment has a preferred form for preferentially emitting the converted wave from the specific fundamental wave path by temperature-controlling the wavelength conversion element 20 using the temperature controller 26. Thus, according to the second embodiment, it is possible to control the angle and intensity distribution of the converted wave to be emitted and the number of beams to be emitted while holding the wavelength of the light emitted from the wavelength conversion laser 200 constant. It is also possible to control the angle, the intensity distribution and the number of beams by executing a temperature control for a part of the wavelength conversion element 20 to give a temperature distribution in the wavelength conversion element 20.

In the wavelength conversion laser 200, the converted waves are emitted in the form of a plurality of beams from the concave mirror 23 as the output surface. Specifically, since the concave mirrors 23, 24 are so arranged right opposite to each other as to be coaxial in this embodiment, the fundamental wave incident on the wavelength conversion element 20 reaches the concave mirror 23 while being spread in a width direction (vertical direction in FIGS. 5 and 6) of the wavelength conversion element 20 between the concave mirrors 23 and 24. In other words, the fundamental wave propagates along a plurality of fundamental wave paths (E1 to E7) present in the width direction of the wavelength conversion element 20 and reaches the concave mirror 23 as a plurality of beams juxtaposed in the width direction. At this time, the fundamental wave paths E1 to E7 extending between the concave mirrors 23 and 24 are at different angles to the width direction of the wavelength conversion element 20. Thus, the converted wave emitted from the concave mirror 23 is the sum of the converted waves (e1, e3, e5, e7) produced on the respective fundamental wave paths (E1, E3, E5, E7), wherefore it is emitted as a lateral multi-beam comprised of multiple beams spaced apart in the width direction of the wavelength conversion element. Here, that the converted wave produced on any one of the fundamental wave path is preferentially emitted while the converted waves produced on a plurality of ones of the fundamental wave paths (E1, E3, E5, E7) are emitted as in the second embodiment means to control a power balance between the converted waves produced on the respective fundamental wave paths E1, E3, E5 and E7. In other words, an intensity distribution of the lateral multi-beam to be emitted can be controlled by the temperature control of the wavelength conversion element 20 in the wavelength conversion laser 200.

This embodiment has a preferred form for controlling the intensity distribution of the converted waves emitted in the form of the lateral multi-beam. Since the wavelength conversion laser 200 according to this embodiment has a plurality of fundamental wave paths, the converted wave can be outputted as a plurality of beams. By forming these plurality of beams into a linear lateral multi-beam, they can be treated as one luminous flux. Here, it is advantageous in applying the wavelength conversion laser 200 to various applied products to be able to control the intensity distribution of the lateral multi-beam. Particularly, this is effective in the field of video and illumination since uniform intensity is necessary. In a conventional laser for emitting a lateral multi-beam, it has been cumbersome to control the intensities of the respective beams included in the multi-beam. However, in the wavelength conversion laser 200 according to this embodiment, the intensities of the respective beams included in a multi-beam can be easily controlled by controlling the conversion efficiencies. Further, since the intensity distribution of the lateral multi-beam can be temporally changed by temporally changing the switching of the fundamental wave path for preferentially emitting the converted wave, interference noise can be reduced.

In the example shown in FIG. 6, the temperature of the wavelength conversion element 20 is controlled by the temperature controller 26 so that more converted wave is produced on the fundamental wave paths E2 to E7 passing the wavelength conversion element after the fundamental wave path E1 than on the fundamental wave path E1 along which the fundamental wave is first incident on the wavelength conversion element. By doing so, the destruction of the wavelength conversion element 20 caused by heat generation can be suppressed for the following reason.

If the powers of the fundamental wave and the converted wave are large, there is a possibility of the heat generation of the wavelength conversion element 20 and the destruction of the wavelength conversion element 20 caused by this heat generation, wherefore the light resistance of the wavelength conversion element 20 becomes problematic. Upon studying this embodiment, since the fundamental wave reciprocates between the concave mirrors 23 and 24 in the wavelength conversion laser 200, it attenuates as it more reciprocates due to loss at the time of reflections on the concave mirrors 23, 24 and consumption during the generation of the converted wave. Thus, a risk of the above heat generation and destruction of the wavelength conversion element 20 is highest on the fundamental wave path E1 along which the fundamental wave is first incident on the wavelength conversion element 20. On the other hand, if a control is executed to produce more converted wave on the fundamental wave paths E2 to E7 passing the wavelength conversion element 20 after the fundamental wave path E1 than on the fundamental wave path E1 along which the fundamental wave is first incident on the wavelength conversion element 20 as shown in FIG. 6, it is preferable since the risk of the above heat generation of the wavelength conversion element 20 and the destruction caused by this heat generation can be avoided. Therefore, it is possible to obtain a wavelength conversion laser with a highly reliable and stable output by executing such a control as shown in FIG. 6.

Third Embodiment

Figure 7:
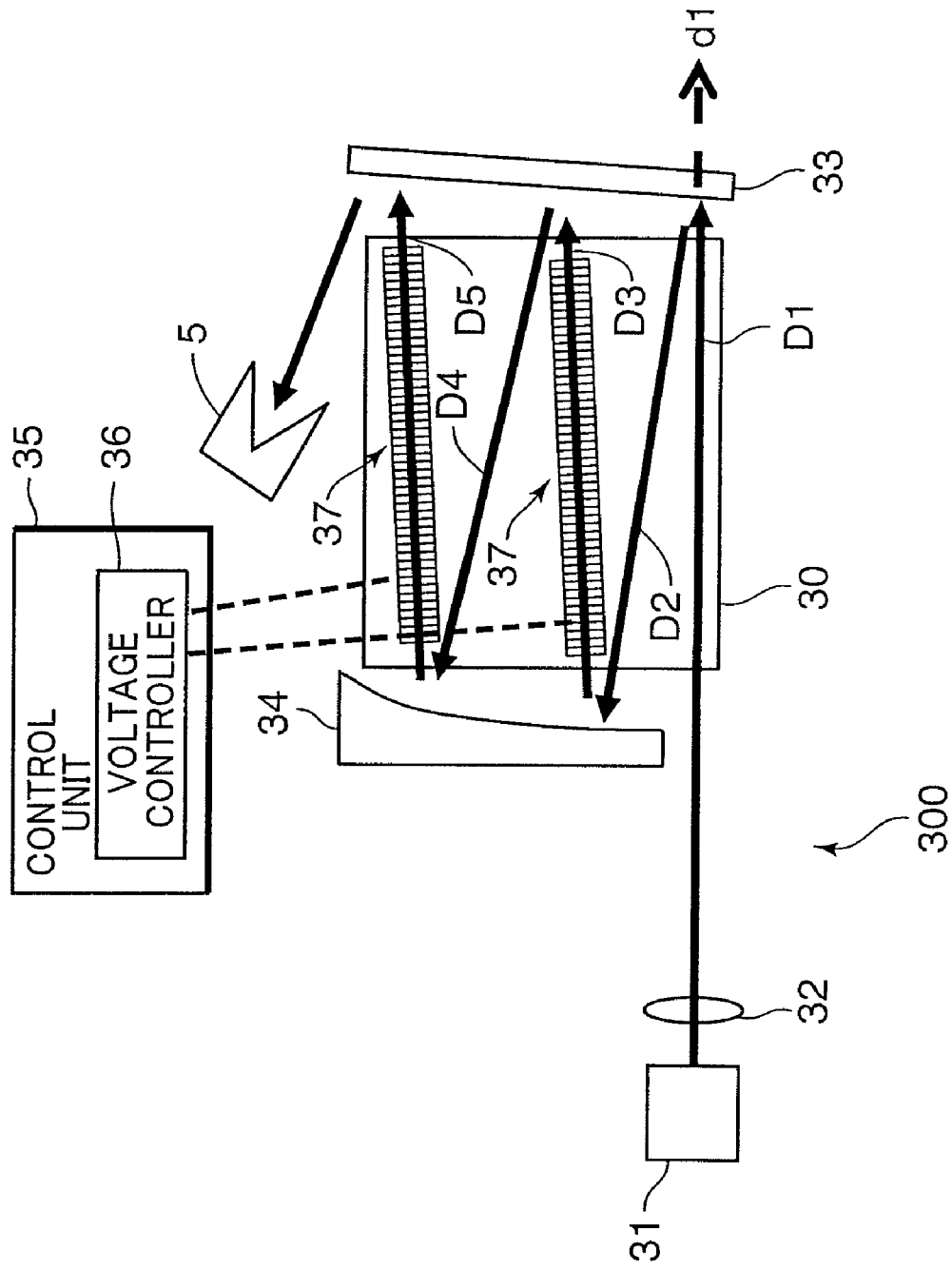
FIG. 7 is a schematic construction diagram of a wavelength conversion laser according to a third embodiment of the invention.
Figure 8:
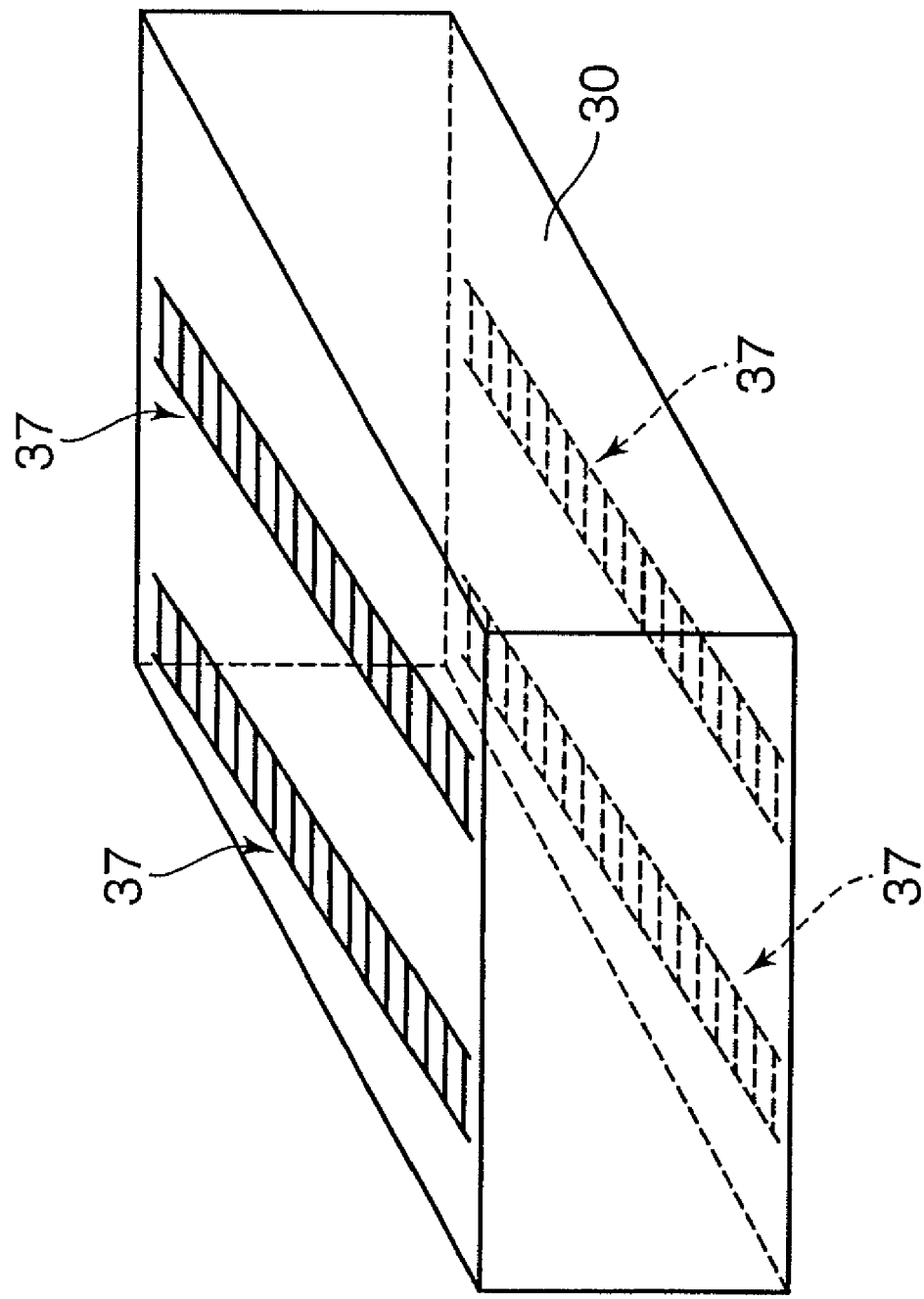
FIG. 8 is a schematic perspective view enlargedly showing the wavelength conversion element of FIG. 7 and electrodes.
Figure 9:
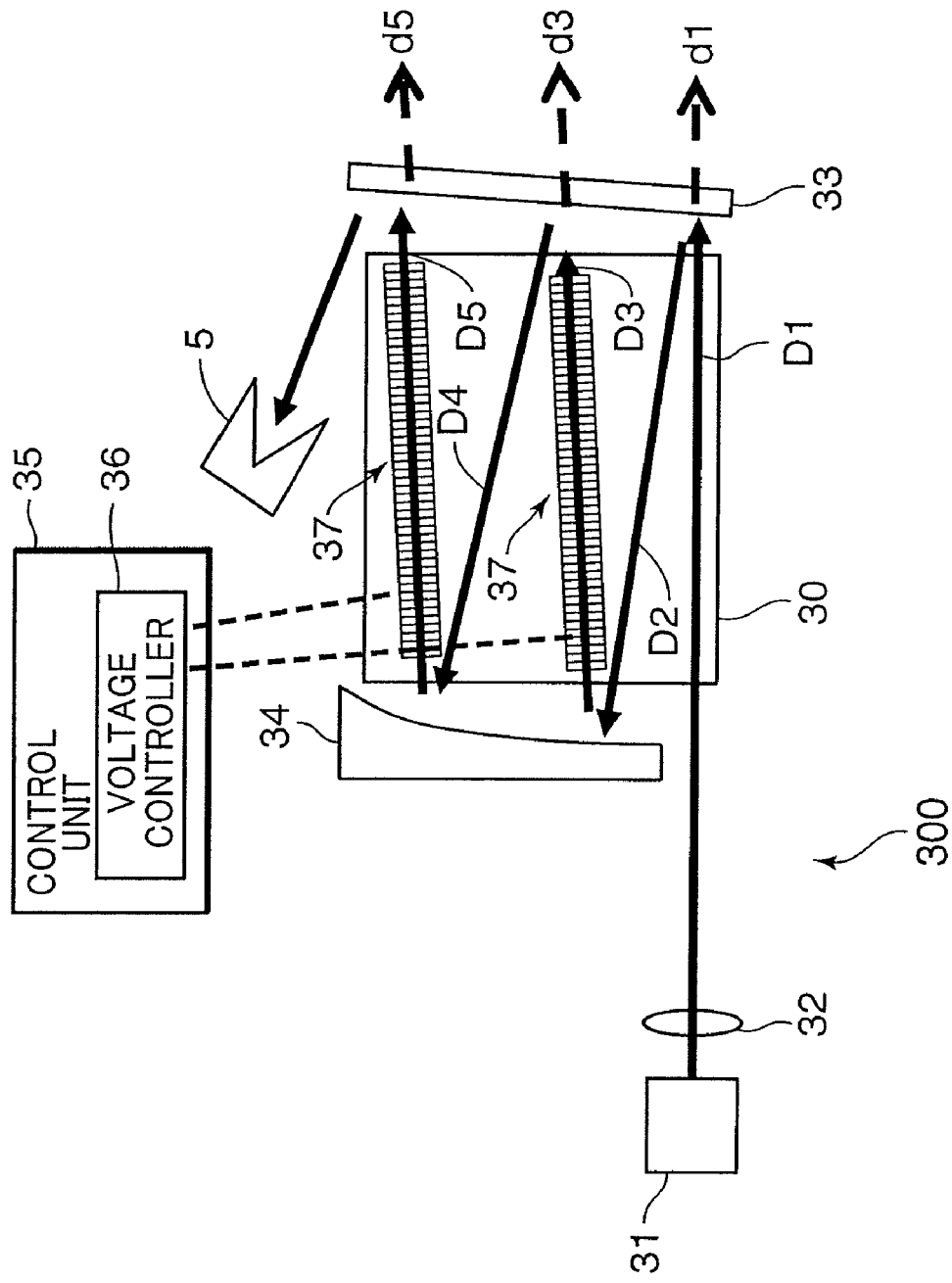
FIG. 9 is a schematic construction diagram showing a state where fundamental wave paths for preferentially emitting converted waves are changed in the wavelength conversion laser of FIG. 7.

FIGS. 7 to 9 are schematic construction diagrams of a wavelength conversion laser 300 according to a third embodiment of the present invention. FIGS. 9 and 9 differ in fundamental wave paths for preferentially emitting converted waves.

The wavelength conversion laser 300 is provided with a mode-lock laser 31 as a laser light source for pulse-oscillating a fundamental wave, a condenser lens 32 for condensing the fundamental wave from the mode-lock laser 31, a wavelength conversion element 30 on which the condensed fundamental wave is to be incident, a dichroic mirror 33 and a concave minor 34 arranged at the opposite sides of the wavelength conversion element 30, electrodes 37 attached to the wavelength conversion element 30 and a control unit 35 for controlling a voltage to be applied to the wavelength conversion element 30.

The mode-lock laser 31 oscillates laser light at a pulse width of 40 psec.

The wavelength conversion element 30 is made of a MgO:LiNbO₃ crystal having a periodical polarization-reversed structure and has a length of 20 mm. Further, the wavelength conversion element 30 has a periodical polarization-reversed structure arranged in a lateral direction of FIG. 7 (lengthwise direction of the wavelength conversion element) and generates a second harmonic as a converted wave by quasi-phase matching of a reversal period. The reversal period of the periodical polarization-reversed structure is uniform in the wavelength conversion element 30. Coating is applied to incident and emergent end surfaces (left and right end surfaces of FIG. 7) of the wavelength conversion element 30 for the fundamental wave for transmitting the fundamental wave and the second harmonic. The temperature of the wavelength conversion element 30 is held constant by an unillustrated constant temperature holding device.

The dichroic mirror 33 has a coating for reflecting the fundamental wave and transmitting the second harmonic and serves as an output surface for emitting the second harmonic as the converted wave. The dichroic mirror 33 is arranged oblique to the lengthwise direction of the wavelength conversion element 30 (lateral direction of FIG. 7) with respect to a posture vertical to an optical axis of the fundamental wave emitted from the mode-lock laser 31. Thus, the fundamental wave reflected by the dichroic minor 33 is incident on the wavelength conversion element 30 again along an optical axis inclined with respect to the lengthwise direction of the wavelength conversion element 30.

The concave mirror 34 has a coating for reflecting the fundamental wave and the second harmonic and functions to condense the fundamental wave. Accordingly, a plurality of fundamental wave paths D1 to D5 extending in different directions are defined between this concave mirror 34 and the dichroic mirror 33. The beam diameter of the fundamental wave propagating along the optical paths D3, D5 out of these fundamental wave paths D1 to D5 is narrowed by the concave mirror 34. The fundamental wave paths D3, D5 pass the wavelength conversion element 30 at angles different from the optical path D1.

The electrodes 37 are comb-like (ladder-like) electrodes provided on the top and under surfaces (upper and bottom surfaces of FIG. 8) of the wavelength conversion element 30. The electrodes 37 are provided on a +z-axis surface and a −z-axis surface in a z-axis direction of the MgO:LiNbO₃ crystal. More specifically, the electrodes 37 are so provided at a total of four positions as to sandwich two regions where the fundamental wave paths D3, D5 are defined. A plurality of sections of the respective electrodes 37 extending in the width direction (vertical direction of FIG. 7) of the wavelength conversion element 30 are respectively formed to correspond to the polarization reversal period of the wavelength conversion element 30.

The control unit 35 includes a voltage controller 36 for controlling a voltage to be applied between the respective electrodes 37. The voltage controller 36 applies voltages between a pair of electrodes 37 arranged to sandwich the fundamental wave path D3 or between a pair of electrodes 37 arranged to sandwich the fundamental wave path D5, thereby generating an electric field in a partial region of the wavelength conversion element 30 where the fundamental wave path D3 or D5 is defined. By switching the voltage application and the stop of the application using the voltage controller 36, the electric field generated in the region of the wavelength conversion element 30 where the fundamental wave path D3 or D5 is defined can be switched. By generating the electric field for the wavelength conversion element 30 in this way, a refractive index of the wavelength conversion element 30 is changed for the regions where the fundamental wave paths D3, D5 are defined.

Pulsed light of the fundamental wave emitted from the mode-lock laser 31 is condensed by the condenser lens 32 and incident on the wavelength conversion element 30. In FIG. 7, phase matching is performed on the fundamental wave path D1 perpendicular to the polarization reversal period and a second harmonic is generated with a high conversion efficiency on this fundamental wave path D1. On the other hand, on the fundamental wave paths D3, D5, the fundamental wave is obliquely incident on the wavelength conversion element 30 and passes the wavelength conversion element 30 while being inclined with respect to the periodical polarization-reversed structure. Thus, on the fundamental wave paths D3, D5, deviations from a phase matching condition occur, the conversion efficiency becomes lower and the second harmonic is hardly produced. Therefore, only a converted wave d1 produced on the fundamental wave path D1 is outputted from the dichroic mirror 33. The pulse width of the converted wave d1 is about 40 psec.

In FIG. 9, an electric field is generated in regions of the wavelength conversion element 30 where the fundamental wave paths D3, D5 are defined by applying a voltage to the respective electrodes 37 using the voltage controller 36. In this way, differences in the refractive index between the second harmonic and the fundamental wave on the fundamental wave paths of the wavelength conversion element 30 are made smaller, thereby decreasing deviation amounts from the phase matching condition even if the optical paths are inclined with respect to the periodical polarization-reversed structure. Thus, the conversion efficiency becomes higher also on the fundamental wave paths D3, D5. As a result, in the example shown in FIG. 9, second harmonics are generated not only on the fundamental wave path D1, but also on the fundamental wave paths D3, D5 and outputted from the dichroic mirror 33.

Here, the pulse duration of the total output of the fundamental wave paths D1, D3 and D5 is about 100 psec. Since output light on the fundamental wave path D3 is temporally delayed from that on the fundamental wave path D1 and output light on the fundamental wave path D5 is temporally delayed from that on the fundamental wave path D3, the pulse width of the total output light is increased twice or more with respect to that of the fundamental wave from the mode-lock laser 31. By further increasing the number of optical paths, the pulse width of the total output light can be increased five times or more. Further, it is also possible to output a pulse of a converted wave of 40 psec at an interval of 45 psec by generating an electric field only in the region corresponding to the fundamental wave path D5 to produce converted waves on the fundamental wave paths D1, D5.

The wavelength conversion laser 300 according to the third embodiment has a preferred form for selecting the fundamental wave paths D1, D3 and D5 where the converted waves are produced by generating the electric field in the wavelength conversion element 30 using the voltage controller 36 to control the deviation amounts from the phase matching condition. In this embodiment, the deviation amounts from the phase matching condition can be controlled by the fundamental wave paths D1, D3 and D5 passing the wavelength conversion element 30 at different angles and the electric field generated in the wavelength conversion element 30. Through the switching by the electric field, the selection of the fundamental wave path can be switched at a high speed. For example, in this embodiment, the selection of the fundamental wave path can be switched within a repetition period of pulsed light.

The wavelength conversion laser 300 has a preferred form for controlling the pulse width and interval of outgoing light by using the mode-lock laser 31 for pulse oscillating the fundamental wave and controlling the number of the fundamental wave paths for emitting the converted wave using the control unit 35. In FIGS. 7 and 9, the pulse width of the outgoing light can be increased from 40 psec to 100 psec by switching the number of the fundamental wave paths for emitting the converted wave from 1 to 3. The pulse width can be increased severalfold by controlling the pulse width based on the number of the fundamental wave paths. As in the case of selecting the fundamental wave paths D1, D5 (case of FIG. 9), pulsed light having a very short pulse interval can be generated. By using this embodiment, light can be emitted with a pulse width and a pulse interval, which are difficult to realize in other lasers.

Figure 10:
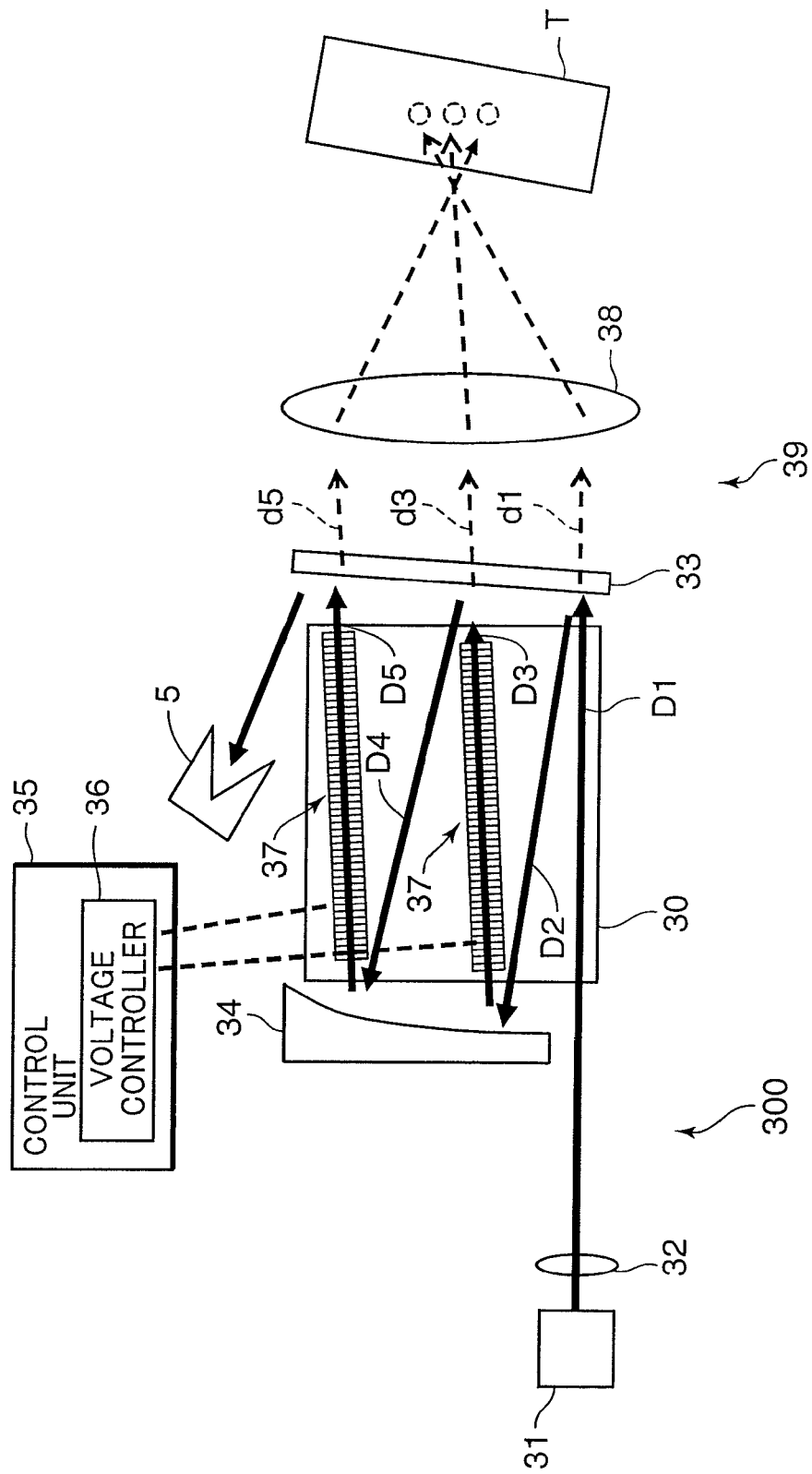
FIG. 10 is a schematic construction diagram of a laser processing device including the wavelength conversion laser according to the third embodiment of the invention.
Figure 11:
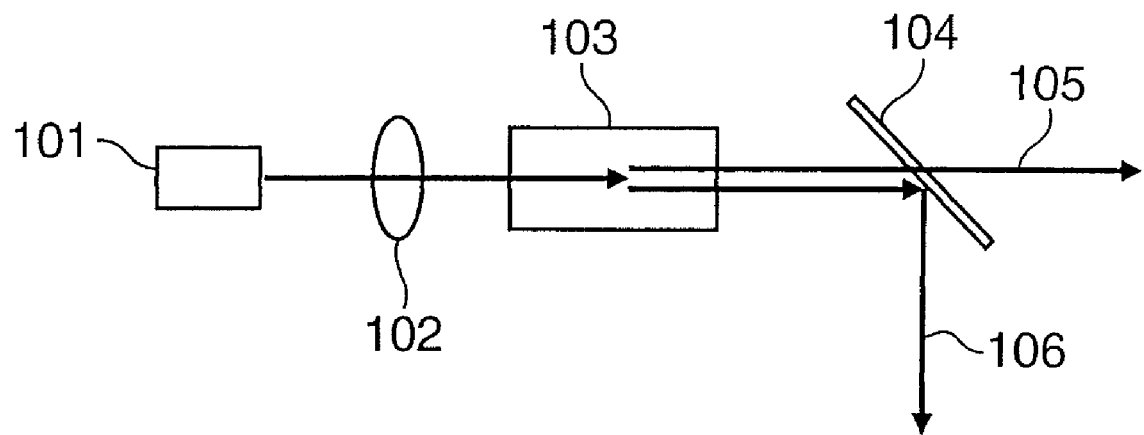
FIG. 11 is a schematic construction diagram of a conventional wavelength conversion laser.

Next, a laser processing device 39 shown in FIG. 10 is described.

FIG. 10 is a schematic diagram of the laser processing device 39 according to a modification of the third embodiment.

The laser processing device 39 is provided with the above wavelength conversion laser 300 and a lens 38 for condensing a converted wave from the wavelength conversion laser 300. By the control unit 35, the wavelength conversion laser 300 can be switched to a case where only the fundamental wave path D1 is selected to output a converted wave d1 and a case where converted waves d1, d3 and d5 are outputted from the fundamental wave paths D1 to D3.

The lens 38 condenses the converted wave from the wavelength conversion laser 300.

In the case of processing using the laser processing device 39, an outer surface of an article T to be processed is arranged near a focus position of the lens 38. Here, since the state of the laser processing device 39 can be switched between the state where only the converted wave d1 is outputted and the state where the converted waves d1 to d3 are outputted as described above, a case of irradiating a beam at one spot and a case of irradiating beams at three linearly arranged spots can be selected for the article T to be processed.

The laser processing device 39 according to this embodiment can change a beam irradiation range (spot shape) for the article T to be processed by selecting the fundamental wave path of the wavelength conversion element 300. By changing the beam irradiation range, a beam irradiation range in conformity with the type of processing can be set, wherefore it is possible to shorten a processing time and improve processing accuracy. Further, the laser processing device 39 according to this embodiment is highly reliable since it can change the beam irradiation range without using a mechanical mechanism. Furthermore, since the fundamental wave paths D1 to D3 for preferentially emitting the converted wave can be temporally continuously changed in the laser processing device 39, a spot shape change and an intermediate spot shape during the emission of the beam can be generated. Therefore, complicated processing can be quickly performed.

The above embodiments are not limited to the above embodiments and can be appropriately changed without departing from the scope of the present invention. Of course, the respective embodiments of the present invention can also be used in combination. It is also possible to use a plurality of fundamental wave light sources and employ a construction for outputting a converted wave such as a differential frequency wave and a sum frequency wave in addition to the second harmonic. Further, the polarization reversal period in the wavelength conversion element may have several types of periods.

The present invention is characterized in that a fundamental wave is reflected between a pair of fundamental wave reflecting surfaces and passes a wavelength conversion element at different angles a plurality of times, at least one of the reflecting surfaces serves as an output surface for transmitting wavelength-converted light, and a control unit is provided to preferentially emit a converted wave on a specified fundamental wave path when wavelength-converted light can be produced on a plurality of fundamental wave paths passing the wavelength conversion element.

In this construction, a plurality of phase matching conditions are given by having the fundamental wave paths having different angles in one wavelength conversion element. A conversion efficiency on a specific fundamental wave path is increased by setting a fundamental wave wavelength or temperature in conformity with the phase matching condition of the specific fundamental wave path using the control unit. On the other hand, since deviations from the phase matching condition occur on the fundamental wave paths other than the specific one, the conversion efficiencies decrease, with the result that the converted wave on the specific fundamental wave path is preferentially emitted. By preferentially emitting the wavelength-converted light from the specific fundamental wave path, the angle, intensity distribution, beam number or the like of the wavelength-converted light to be emitted can be controlled.

The above specific embodiments mainly embrace inventions having the following constructions.

A wavelength conversion laser according to one aspect of the present invention comprises a fundamental wave light source for emitting a fundamental wave; a wavelength conversion element for converting the fundamental wave from the fundamental wave light source into a converted wave; a pair of fundamental wave reflecting surfaces for reflecting the fundamental wave to define a plurality of fundamental wave paths passing the wavelength conversion element at different angles; and a control unit for controlling wavelength conversion efficiencies so that the wavelength conversion efficiency on a specific one of the plurality of fundamental wave paths extending in different directions between the pair of fundamental wave reflecting surfaces is highest, wherein at least one of the pair of fundamental wave reflecting surfaces serves as an output surface for transmitting the converted wave.

According to the present invention, since the plurality of fundamental wave paths passing the wavelength conversion element at different angles are defined, a plurality of phase matching conditions are present in conformity with the plurality of fundamental wave paths extending in different directions between the pair of fundamental wave reflecting surfaces. In the present invention, since the wavelength conversion efficiencies can be controlled by the control unit so that the wavelength conversion efficiency on the specific one of the respective fundamental wave paths is highest, the converted wave can be preferentially emitted in the direction (at the angle) corresponding to this fundamental wave path.

Thus, according to the present invention, a wavelength conversion laser can be provided which can control the angle, intensity distribution and pulse duration of the converted wave to be emitted.

It is sufficient that the pair of fundamental wave reflecting surfaces according to the present invention reflect the fundamental wave and at least one of the pair of fundamental wave reflecting surfaces gives an angular variation to the optical path of the fundamental wave. For example, the fundamental wave reflecting surfaces may not be flat surfaces, but convex or concave surfaces or the end surfaces of the wavelength conversion element may be used as the fundamental wave reflecting surfaces. The reflecting surfaces may be spherical, aspherical or cylindrical surfaces.

Specifically, the control unit may include a temperature controller for controlling the temperature of the wavelength conversion element; and the temperature controller may select the specific fundamental wave path by temperature-controlling the wavelength conversion element.

According to this construction, the wavelength conversion efficiencies on the respective fundamental wave paths can be controlled by changing the temperature of the wavelength conversion element to change the phase matching condition of the wavelength conversion element.

The control unit may include an oscillation wavelength controller for controlling an oscillation wavelength of the fundamental wave by the fundamental wave light source; and the oscillation wavelength controller may select the specified fundamental wave path by controlling the oscillation wavelength of the fundamental wave.

According to this construction, the wavelength conversion efficiencies on the plurality of fundamental wave paths can be controlled by changing the oscillation wavelength of the fundamental wave by the fundamental wave light source.

The control unit may include a voltage controller for applying a voltage to the wavelength conversion element to generate an electric field in the wavelength conversion element; and the voltage controller may select the specific fundamental wave path by generating an electric field in the wavelength conversion element.

According to this construction, the wavelength conversion efficiencies on the plurality of fundamental wave paths can be controlled by applying a voltage to the wavelength conversion element to change a refractive index of the wavelength conversion element.

In the above wavelength conversion laser, it is preferable that a light receiving element capable of detecting the light quantity of the converted wave emitted from at least one of the respective fundamental wave paths is further provided; and the control unit controls the wavelength conversion efficiencies based on the light quantity detected by the light receiving element so that the wavelength conversion efficiency on the specific fundamental wave path is highest.

According to this construction, the wavelength conversion efficiency on the specific fundamental wave path can be reliably set highest by executing a feedback control.

In the above wavelength conversion laser, the control unit preferably causes converted waves produced on at least two or more of the respective fundamental wave paths to be simultaneously emitted as a multi-beam and controls an intensity distribution of the multi-beam.

According to this construction, since the converted waves are emitted as the multi-beam from at least two or more optical paths, the intensity distribution of the multi-beam can be controlled by controlling the wavelength conversion efficiencies on the respective optical paths.

In the above wavelength conversion laser, it is preferable that the fundamental wave light source pulse-oscillates the fundamental wave; and that the control unit controls at least either one of the pulse width and interval of the converted wave to be emitted from the output surface by increasing or decreasing the number of the optical paths for emitting the converted waves out of the respective fundamental wave paths.

In the case of pulse-oscillating the fundamental wave in this way, there is a situation where a converted wave is produced on another fundamental wave path even if no converted wave is produced on one fundamental wave path because of differences in optical path length from the fundamental wave light source to the respective fundamental wave paths. Accordingly, in the above construction, the pulse width and interval of the converted wave to be emitted from the output surface can be controlled by increasing or decreasing the number of the fundamental wave paths for emitting the converted waves utilizing the differences in the optical path length.

In the above wavelength conversion laser, the control unit preferably controls the wavelength conversion efficiencies so that the wavelength conversion efficiency on the optical path after the first one of the respective fundamental wave paths the fundamental wave first passes is higher than that on the first fundamental wave path.

According to this construction, the destruction of the wavelength conversion element caused by heat generation can be suppressed for the following reason. Since the power of the fundamental wave is large on the fundamental wave path the fundamental wave first passes, the power of the converted wave produced on the first fundamental wave path increases if the wavelength conversion efficiency on the first fundamental wave path is increased, with the result that an amount of heat generation of the wavelength conversion element resulting from the absorption of this converted wave becomes larger. In contrast, the power of the fundamental wave after passing the first fundamental wave path is decreased by as much as the fundamental wave is wavelength-converted. Thus, even if the wavelength conversion efficiency on the following fundamental wave path is increased, the power of a converted wave produced thereon is small and an amount of heat generation of the wavelength conversion element is also small. Therefore, the destruction of the wavelength conversion element can be suppressed.

In the above wavelength conversion laser, the control unit preferably successively switches the fundamental wave paths for emitting the converted waves so that each converted wave emitted from the output surface scans a specified range.

According to this construction, the converted wave can be outputted as scanning light for scanning the specified range.

An image display device according to another aspect of the present invention comprises the above wavelength conversion laser, and a modulation element for modulating a converted wave emitted from the wavelength conversion laser to display a specified image.

According to the present invention, a converted wave can be introduced to a proper position of the modulation element according to an image to be displayed, using the converted wave emitted in a specific direction from the wavelength conversion laser. Therefore, it is possible to improve the contrast of the image and reduce power consumption.

A laser processing device according to still another aspect of the present invention comprises the above wavelength conversion laser; and a condensing optical element for condensing a converted wave emitted from the wavelength conversion laser, wherein a spot shape of the converted wave is changed by increasing or decreasing the number of optical paths for emitting converted waves out of the respective fundamental wave paths.

According to the present invention, it is possible to shorten a processing time and improve processing accuracy by changing the spot shape of the converted wave according to the type of processing.

INDUSTRIAL APPLICABILITY

The present invention is applicable to a wavelength conversion laser for wavelength-converting a fundamental wave from a fundamental wave light source.

What is claimed is:

1. A wavelength conversion laser, comprising:
a fundamental wave light source for emitting a fundamental wave;
a wavelength conversion element for converting the fundamental wave from the fundamental wave light source into a converted wave, the wavelength conversion element having a periodically polarization-reversed structure;
a pair of fundamental wave reflecting surfaces for reflecting the fundamental wave to define a plurality of fundamental wave paths passing the periodically polarization-reversed structure of the wavelength conversion element at different angles; and
a control unit for controlling wavelength conversion efficiencies so that a wavelength conversion efficiency on a specific one of the plurality of fundamental wave paths between the pair of fundamental wave reflecting surfaces is highest,
wherein at least one of the pair of fundamental wave reflecting surfaces serves as an output surface for transmitting the converted wave.

2. A wavelength conversion laser according to claim 1, wherein the control unit includes a temperature controller for controlling a temperature of the wavelength conversion element, and
wherein the temperature controller selects the specific fundamental wave path by temperature-controlling the wavelength conversion element.

3. A wavelength conversion laser according to claim 1, wherein:
wherein the control unit includes an oscillation wavelength controller for controlling an oscillation wavelength of the fundamental wave emitted by the fundamental wave light source, and
wherein the oscillation wavelength controller selects the specified fundamental wave path by controlling the oscillation wavelength of the fundamental wave.

4. A wavelength conversion laser according to claim 1, wherein the control unit includes a voltage controller for applying a voltage to the wavelength conversion element to generate an electric field in the wavelength conversion element, and
wherein the voltage controller selects the specific fundamental wave path by generating the electric field in the wavelength conversion element.

5. A wavelength conversion laser according to claim 1, further comprising a light receiving element capable of detecting a light quantity of a converted wave emitted from at least one of the fundamental wave paths,
wherein the control unit controls the wavelength conversion efficiencies based on the light quantity detected by the light receiving element so that the wavelength conversion efficiency on the specific fundamental wave path is highest.

6. A wavelength conversion laser according to claim 1, wherein the control unit causes converted waves produced on at least two or more of the respective fundamental wave paths to be simultaneously emitted as a multi-beam and controls an intensity distribution of the multi-beam.

7. A wavelength conversion laser according to claim 1, wherein the fundamental wave light source pulse-oscillates the fundamental wave, and
wherein the control unit controls at least either one of the pulse width and interval of the converted wave to be emitted from the output surface by increasing or decreasing a number of optical paths for emitting converted waves out of the respective fundamental wave paths.

8. A wavelength conversion laser according to claim 1, wherein the control unit controls the wavelength conversion efficiencies so that the wavelength conversion efficiency on an optical path after a first fundamental wave path that the fundamental wave first passes is higher than that on the first fundamental wave path.

9. A wavelength conversion laser according to claim 1, wherein the control unit successively switches fundamental wave paths for emitting converted waves so that each converted wave emitted from the output surface scans a specified range.

10. An image display device, comprising:

a wavelength conversion laser including

- a fundamental wave light source for emitting a fundamental wave,
- a wavelength conversion element for converting the fundamental wave from the fundamental wave light source into a converted wave, the wavelength conversion element having a periodically polarization-reversed structure,
- a pair of fundamental wave reflecting surfaces for reflecting the fundamental wave to define a plurality of fundamental wave paths passing the periodically polarization-reversed structure of the wavelength conversion element at different angles, wherein at least one of the pair of fundamental wave reflecting surfaces serves as an output surface for transmitting the converted wave, and
- a control unit for controlling wavelength conversion efficiencies so that a wavelength conversion efficiency on a specific one of the plurality of fundamental wave paths between the pair of fundamental wave reflecting surfaces is highest; and a modulation element for modulating the converted wave emitted from the wavelength conversion laser to display a specified image.

11. A laser processing device, comprising:

a wavelength conversion laser including

- a fundamental wave light source for emitting a fundamental wave,
- a wavelength conversion element for converting the fundamental wave from the fundamental wave light source into a converted wave, the wavelength conversion element having a periodically polarization-reversed structure,
- a pair of fundamental wave reflecting surfaces for reflecting the fundamental wave to define a plurality of fundamental wave paths passing the periodically polarization-reversed structure of the wavelength conversion element at different angles, wherein at least one of the pair of fundamental wave reflecting surfaces serves as an output surface for transmitting the converted wave, and
- a control unit for controlling wavelength conversion efficiencies so that a wavelength conversion efficiency on a specific one of the plurality of fundamental wave paths between the pair of fundamental wave reflecting surfaces is highest; and a condensing optical element for condensing the converted wave emitted from the wavelength conversion laser, wherein a spot shape of the converted wave is changed by increasing or decreasing a number of optical paths for emitting converted waves out of the respective fundamental wave paths.

* * * * *